(12) United States Patent
Kobayashi et al.

(10) Patent No.: US 12,288,675 B2
(45) Date of Patent: *Apr. 29, 2025

(54) CYLINDRICAL CAVITY WITH IMPEDANCE SHIFTING BY IRISES IN A POWER-SUPPLYING WAVEGUIDE

(71) Applicant: APPLIED MATERIALS, INC., Santa Clara, CA (US)

(72) Inventors: Satoru Kobayashi, Santa Clara, CA (US); Hideo Sugai, Kasugai (JP); Toan Tran, San Jose, CA (US); Soonam Park, Sunnyvale, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/605,539

(22) Filed: Mar. 14, 2024

(65) Prior Publication Data
US 2024/0222084 A1    Jul. 4, 2024

Related U.S. Application Data

(60) Continuation of application No. 17/542,781, filed on Dec. 6, 2021, now Pat. No. 11,972,930, which is a
(Continued)

(51) Int. Cl.
*H01J 37/32* (2006.01)

(52) U.S. Cl.
CPC .. *H01J 37/32293* (2013.01); *H01J 37/32192* (2013.01); *H01J 37/32211* (2013.01);
(Continued)

(58) Field of Classification Search
CPC ........... H01J 37/32293; H01J 37/32292; H01J 37/32211; H01J 37/32229; H01J 37/32935; H01J 2237/334
See application file for complete search history.

(56) References Cited

U.S. PATENT DOCUMENTS

| 2,765,404 A | 10/1956 | Arams |
| 4,689,459 A | 8/1987 | Gerling |

(Continued)

FOREIGN PATENT DOCUMENTS

| CN | 1038121 | 12/1989 |
| CN | 1670997 | 9/2005 |

(Continued)

OTHER PUBLICATIONS

International Search Report and Written Opinion in International Appln. No. PCT/US2016/057726, dated Jan. 23, 2017, 8 pages.
(Continued)

*Primary Examiner* — Alexander H Taningco
*Assistant Examiner* — Pedro C Fernandez
(74) *Attorney, Agent, or Firm* — Fish & Richardson P.C.

(57) ABSTRACT

A plasma reactor has a cylindrical microwave cavity overlying a workpiece processing chamber, a microwave source having a pair of microwave source outputs, and a pair of respective waveguides. The cavity has first and second input ports in a sidewall and space apart by an azimuthal angle. Each of the waveguides has a microwave input end coupled to a microwave source output and a microwave output end coupled to a respective one of the first and second input ports, a coupling aperture plate at the output end with a rectangular coupling aperture in the coupling aperture plate, and an iris plate between the coupling aperture plate and the microwave input end with a rectangular iris opening in the iris plate.

13 Claims, 8 Drawing Sheets

Related U.S. Application Data continuation of application No. 16/459,362, filed on Jul. 1, 2019, now Pat. No. 11,195,699, which is a division of application No. 15/180,425, filed on Jun. 13, 2016, now Pat. No. 10,340,124.

(60) Provisional application No. 62/247,955, filed on Oct. 29, 2015.

(52) U.S. Cl.
CPC .. *H01J 37/32229* (2013.01); *H01J 37/32935* (2013.01); *H01J 2237/334* (2013.01)

(56) References Cited

U.S. PATENT DOCUMENTS

| | | | |
|---|---|---|---|
| 4,727,293 | A | 2/1988 | Asmussen et al. |
| 4,914,052 | A | 4/1990 | Kanai |
| 5,153,406 | A | 10/1992 | Smith |
| 5,188,862 | A | 2/1993 | Itatani et al. |
| 5,632,921 | A | 5/1997 | Risman et al. |
| 5,736,818 | A | 4/1998 | Ulczynski et al. |
| 5,776,552 | A | 7/1998 | Tanabe et al. |
| 6,082,293 | A | 7/2000 | Kawashima |
| 6,158,383 | A | 12/2000 | Watanabe et al. |
| 6,910,440 | B2 | 6/2005 | Ishii et al. |
| 8,075,733 | B2 | 12/2011 | Watanabe et al. |
| 8,776,719 | B2 | 7/2014 | Radiou et al. |
| 9,520,272 | B2 | 12/2016 | Ikeda et al. |
| 10,153,133 | B2 * | 12/2018 | Kobayashi ........ H01J 37/32302 |
| 10,340,124 | B2 | 7/2019 | Kobayashi et al. |
| 11,195,699 | B2 | 12/2021 | Kobayashi et al. |
| 11,972,930 | B2 | 4/2024 | Kobayashi et al. |
| 2002/0050486 | A1 | 5/2002 | Ishii |
| 2004/0261717 | A1 * | 12/2004 | Ishii .................. H01P 5/04 118/723 I |
| 2005/0173382 | A1 | 8/2005 | Ishii et al. |
| 2005/0211382 | A1 | 9/2005 | Ishii et al. |
| 2007/0045242 | A1 | 3/2007 | Goto et al. |
| 2007/0133919 | A1 | 6/2007 | Ohmi et al. |
| 2008/0196243 | A1 | 8/2008 | Brueckl |
| 2009/0159214 | A1 | 6/2009 | Kasai |
| 2012/0299671 | A1 | 11/2012 | Ikeda et al. |
| 2012/0326803 | A1 | 12/2012 | Lee |
| 2013/0062193 | A1 | 3/2013 | Proudkii et al. |
| 2013/0284369 | A1 | 10/2013 | Kobayashi et al. |
| 2013/0284370 | A1 | 10/2013 | Collins et al. |
| 2014/0055034 | A1 | 2/2014 | Coumou |
| 2014/0265910 | A1 | 9/2014 | Kobayashi et al. |
| 2014/0377966 | A1 * | 12/2014 | Funk ................. H01J 37/32192 438/795 |
| 2015/0126046 | A1 * | 5/2015 | Funk ................. H01J 37/32229 118/723 AN |
| 2015/0270105 | A1 * | 9/2015 | Kobayashi .......... H01J 37/3299 315/34 |
| 2015/0270106 | A1 | 9/2015 | Kobayashi et al. |
| 2016/0029472 | A1 | 1/2016 | Jevtic et al. |
| 2019/0362944 | A1 * | 11/2019 | Kobayashi .......... H01J 37/3244 |

FOREIGN PATENT DOCUMENTS

| | | |
|---|---|---|
| EP | 0578047 | 1/1994 |
| EP | 2541811 | 1/2013 |
| JP | S56-045204 | 4/1981 |
| JP | S62-030406 | 2/1987 |
| JP | S63-054934 | 3/1988 |
| JP | H02-246178 | 10/1990 |
| JP | H04-063001 | 2/1992 |
| JP | H09-283300 | 10/1997 |
| JP | H09-289099 | 11/1997 |
| JP | H11-251299 | 9/1999 |
| JP | 2005-033423 | 2/2005 |
| JP | 2007-180034 | 7/2007 |
| JP | 2010-192750 | 9/2010 |
| JP | 2014-524106 | 9/2014 |
| JP | 2018-532221 | 11/2018 |
| TW | 201130398 | 9/2011 |
| TW | 201204186 | 1/2012 |
| TW | 201408139 | 2/2014 |
| WO | WO 2003/101160 | 12/2003 |
| WO | WO 2005/088763 | 9/2005 |
| WO | WO 2006/124734 | 11/2006 |

OTHER PUBLICATIONS

Notice of Allowance in Japanese Appln. No. 2023-000368, dated Jan. 30, 2024, 5 pages (with English translation).

Office Action in Chinese Appln. No. 201680019383.4, dated Feb. 2, 2019, 11 pages (with English translation).

Office Action in Japanese Appln. No. 2017-550840, dated Sep. 15, 2020, 31 pages (with English translation).

Office Action in Japanese Appln. No. 2021-074706, dated Jun. 14, 2022, 10 pages (with English translation).

Office Action in Taiwanese Appln. No. 105134404, dated Sep. 20, 2019, 10 pages (with English translation).

Office Action in Taiwanese Appln. No. 109118939, dated Nov. 7, 2022, 10 pages (with English search report and summary).

* cited by examiner

CYLINDRICAL CAVITY WITH IMPEDANCE SHIFTING BY IRISES IN A POWER-SUPPLYING WAVEGUIDE

CROSS-REFERENCE TO RELATED APPLICATIONS

This application is continuation of U.S. application Ser. No. 17/542,781, filed Dec. 6, 2021, which is a continuation of U.S. application Ser. No. 16/459,362, filed Jul. 1, 2019, which is a divisional of U.S. application Ser. No. 15/180,425, filed Jun. 13, 2016, which claims the benefit of U.S. Provisional Application No. 62/247,955, filed Oct. 29, 2015, the disclosures of which are incorporated by reference.

BACKGROUND

Technical Field

The disclosure concerns the production of rotating microwaves in a plasma reactor chamber.

Background Discussion

In one approach for generating rotating microwaves in a plasma reactor chamber, microwaves are radiated into a cylindrical cavity from two ports separated spatially 90 degree. By setting a temporal phase difference between the microwaves from the two ports at 90 degrees, the $TE_{111}$ mode in a cylindrical cavity is rotated circularly with feedback control by two monitoring antennas, providing a plasma profile of high uniformity.

In another approach for generating rotating microwaves, temporal phases between the two microwaves radiated from the two ports are kept in phase. To produce rotation, an amplitude of the microwaves from one port is modulated in the form of $A\sin\Omega t$, while an amplitude of microwaves from the other port is modulated in the form of $A\cos\Omega t$. Here, $\Omega$ is an angular frequency of order of 1-1000 Hz, which is much smaller than that of a microwave carrier frequency of order of over 1 GHz. This dual injection rotates the $TE_{111}$ mode at a slow frequency $\Omega$ so as to slowly agitate a localized plasma, spreading the plasma into a wider area to further increase a uniformity of plasma distribution, particularly at high pressures.

However, the fast and slow rotations were provided only for the $TE_{111}$ mode. There is a need to provide such rotation for any mode, not just the $TE_{111}$ mode.

SUMMARY

In a plasma reactor comprising a cylindrical microwave cavity overlying a workpiece processing chamber, and first and second microwave input ports P and Q in a sidewall of the cylindrical microwave cavity spaced apart by an offset angle $\Delta\theta$, a method is provided for generating rotating microwaves of mode $TE_{mnl}$ or $TM_{mnl}$ in the cylindrical microwave cavity, wherein n, m and l are user-selected values of a TE or TM mode. The method comprises: introducing into the cylindrical microwave cavity, through respective ones of the first and second coupling apertures, respective microwave signals separated by a temporal phase difference $\Delta\emptyset$; adjusting values of the offset angle $\Delta\theta$ and the temporal phase difference $\Delta\emptyset$ to values which are a function of at least two of the user-selected TE or TM mode indices m, n and l so as to produce rotating microwaves of mode $TE_{mnl}$ or $TM_{mnl}$ in the cylindrical microwave cavity.

In one embodiment, the function is defined as:

$$\begin{cases} \dfrac{m\Delta\theta - \Delta\phi}{2} = \dfrac{\pi}{2} + k\pi & k: \text{integer} \\ \Delta\phi \neq p\pi & p: \text{integer} \end{cases}$$

In one embodiment, the rotating microwaves rotate clockwise with the rotation frequency equal to an operational microwave frequency.

In one embodiment, to maximize the energy transfer efficiency of the clockwise rotation, the function is defined as:

$$\begin{cases} \dfrac{m\Delta\theta - \Delta\phi}{2} = \dfrac{\pi}{2} + k\pi & k: \text{integer} \\ \dfrac{m\Delta\theta + \Delta\phi}{2} = p\pi & p: \text{integer} \end{cases}$$

In one embodiment, the function is defined as:

$$\begin{cases} \dfrac{m\Delta\theta + \Delta\phi}{2} = \dfrac{\pi}{2} + k\pi & k: \text{integer} \\ \Delta\phi \neq p\pi & p: \text{integer} \end{cases}$$

In one embodiment, the rotating microwaves rotate anticlockwise with the rotation frequency equal to an operational microwave frequency.

In one embodiment, to maximize the energy transfer efficiency of the anticlockwise rotation, the function is defined as:

$$\begin{cases} \dfrac{m\Delta\theta + \Delta\phi}{2} = \dfrac{\pi}{2} + k\pi & k: \text{integer} \\ \dfrac{m\Delta\theta - \Delta\phi}{2} = p\pi & p: \text{integer} \end{cases}$$

In one embodiment, a first one of the respective microwave signals is of a form:

$$H_P \propto \cos(\eta + m\theta - \omega t) + \cos(\eta + m\theta + \omega t)$$

where $\omega$ is an angular frequency of the respective microwave signals and t is time, and $$\eta = 0 \text{ or } \frac{\pi}{2}.$$

In one embodiment, a second one of the respective microwave signals is of a form:

$$H_Q \propto \cos[\eta + m(\theta - \Delta\theta) - (\omega t - \Delta\phi)] + \cos[\eta + m(\theta - \Delta\theta) + (\omega t - \Delta\phi)]$$

where ω is an angular frequency of the microwave signals and t is time, and $$\eta = 0 \text{ or } \frac{\pi}{2}.$$

In a plasma reactor comprising a cylindrical microwave cavity overlying a workpiece processing chamber, and first and second input ports P and Q in a sidewall of said cylindrical microwave cavity spaced apart by a general angle, a method is provided for generating rotating microwaves in said cylindrical microwave cavity with rotation frequency $\Omega_a$, the method comprising:

setting said general angle to satisfy the following equations:

$$\hat{a} = a_x \hat{x} + a_y \hat{y}$$
$$\hat{b} = b_x \hat{x} + b_y \hat{y};$$

inputting to input ports P and Q microwave fields represented respectively by:

$$\zeta_{Pa} = r\cos(\omega t + \varphi_h)$$
$$\zeta_{Qb} = s\cos(\omega t + \varphi_h)$$

where r and s are defined in the following equations:

$$r = \frac{\alpha \cos\Omega_a t b_y \mp \alpha \sin\Omega_a t b_x}{V}$$
$$s = \frac{-\alpha \cos\Omega_a t a_y \pm \alpha \sin\Omega_a t a_x}{V}$$

and the sign ∓ in "r" determines whether the rotation is anticlockwise or clockwise.

In accordance with a further aspect, a plasma reactor comprises: a cylindrical microwave cavity overlying a workpiece processing chamber, and first and second input ports, P and Q, in a sidewall of the cylindrical microwave cavity spaced apart by an azimuthal angle; a microwave source having a microwave frequency and having a pair of microwave source outputs; a pair of respective waveguides, each of the respective waveguides having a microwave input end coupled to a respective one of the microwave source outputs and a microwave output end coupled to a respective one of the first and second input ports; a coupling aperture plate at the output end, and a rectangular coupling aperture in the coupling aperture plate; an iris plate between the coupling aperture plate and the microwave input end, and a rectangular iris opening in the iris plate.

In one embodiment, the rectangular coupling aperture and the rectangular iris opening have respective parallel axes along a long dimension of a respective one of the coupling aperture and the iris opening, the respective parallel axes being parallel to an axis of symmetry of the cylindrical microwave cavity.

In one embodiment, each of the waveguides has a microwave propagation direction between the microwave input end and the microwave output end, the microwave propagation direction extending toward an axis of symmetry of the cylindrical microwave cavity.

In one embodiment, the rectangular coupling aperture has long and short dimensions e and f, respectively, corresponding to a user-selected impedance.

In one embodiment, the rectangular iris opening has long and short dimensions c and d, respectively, corresponding to a user-selected resonance.

In one embodiment, the rectangular iris is a capacitive iris and has a long dimension parallel to an axis of symmetry of the cylindrical microwave cavity.

In one embodiment, the rectangular iris is an inductive iris and has a short dimension parallel to the axis of symmetry of the cylindrical microwave cavity.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
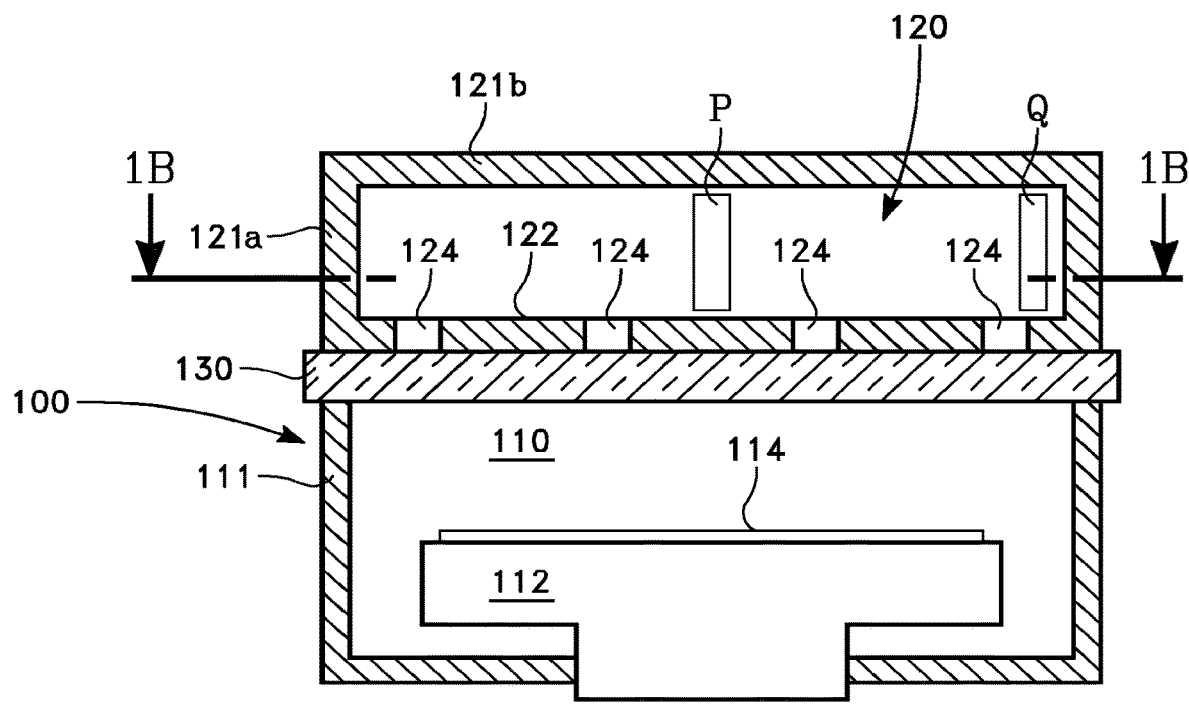
FIG. 1A is cross-sectional elevational view of a plasma reactor that may be used in carrying out embodiments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Introduction

In the present description, microwave field rotations are provided for the general case of $TE_{mnl}$ and $TM_{mnl}$ in a cylindrical cavity, where m, n and l are suitable integers chosen by the user. Our recent experimental work confirms that a $TE_{121}$ mode makes a higher uniformity of plasma distribution under some conditions.

In addition, a method for changing a chamber impedance by using irises installed in a power-supplying waveguide is disclosed. In general, a cylindrical cavity has a bottom plate on which radiation slots are cut out to transfer microwave energy from the cavity to plasma. For a given design of the radiation slots, the chamber impedance is fixed. If the chamber impedance is in a region controlled by a stub tuner, the stub-tuner will make an impedance matching easily. Otherwise, the tuning becomes unpredictable or unstable to make an oscillation of the tuning position. Inversely, if the chamber impedance is controlled, it can be moved to tuner-preferred regions, which further leads to reduction of numbers of stubs, leading to cost reduction. The method proposed herein is simple, and moves the chamber impedance into wide ranges in the Smith chart as demonstrated in our recent experiments. The adoption of this method will provide stable plasma tuning and chamber-to-chamber etching/plasma matching.

Figure 1B:
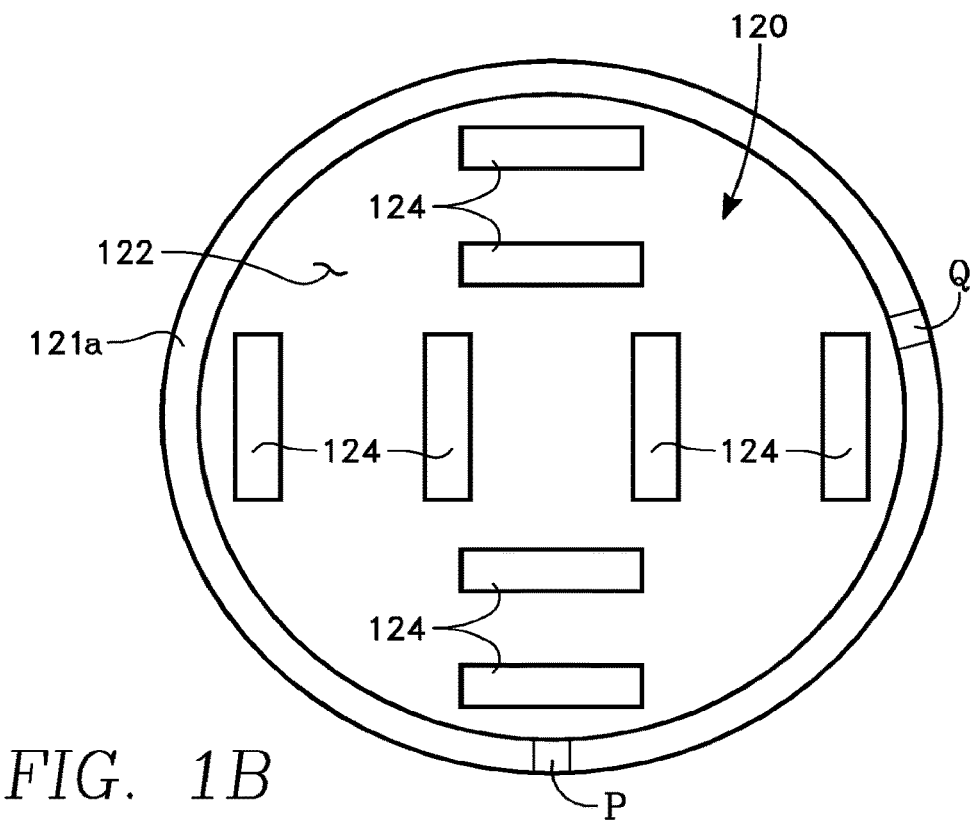
FIG. 1B is a plan view corresponding to FIG. 1A.
Figure 1C:
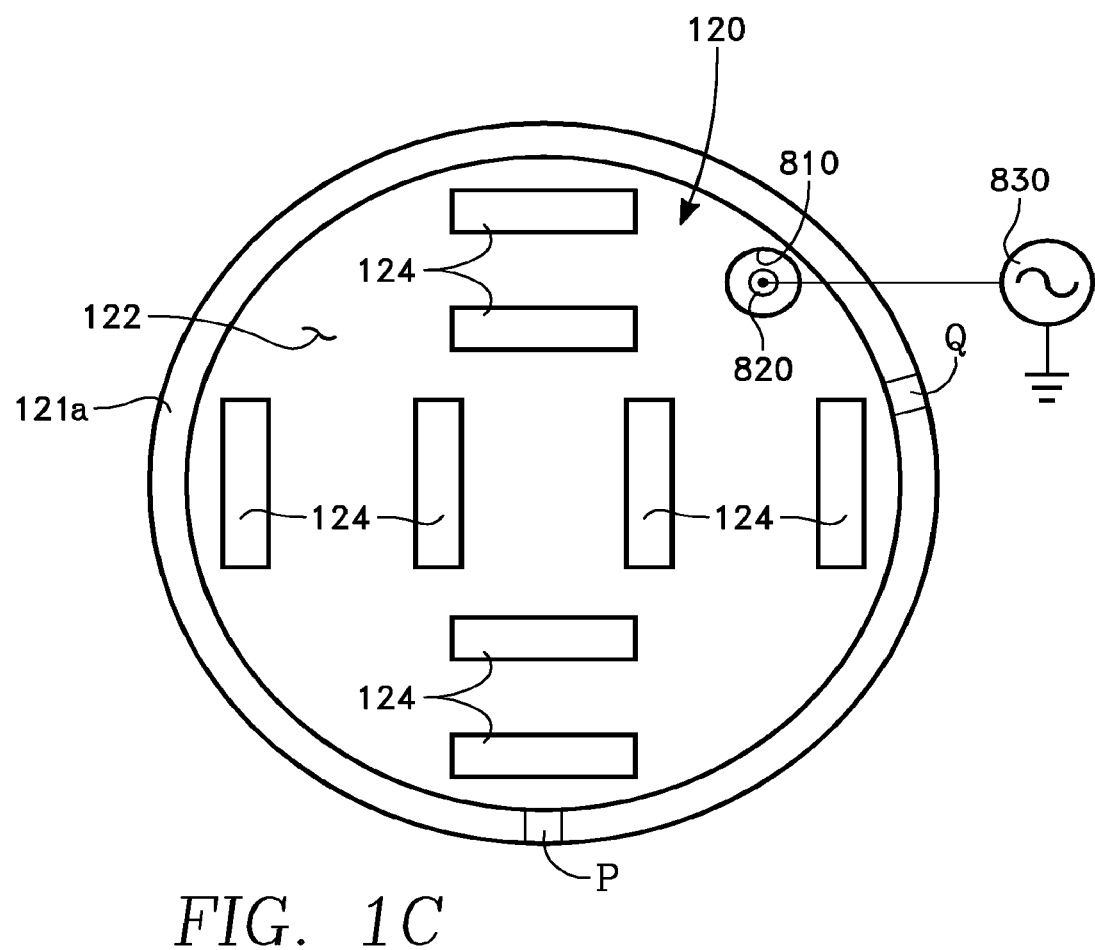
FIG. 1C is a plan view of a related reactor.

Fast Rotation of $TE_{mnl}$ and $TM_{mnl}$ Modes In a Cylindrical Cavity With a Microwave Carrier Frequency In this description, fast rotation is defined as a field rotation with the same rotation frequency as an operational microwave frequency. FIG. 1A is a simplified side view of a plasma reactor 100 including a processing chamber 110 enclosed by a wall 111 and containing gas under vacuum pressure and a workpiece support 112 for supporting a workpiece 114. A cylindrical cavity 120 overlying the processing chamber 110 is enclosed by a side wall 121a, a ceiling 121b and a floor 122 having slots 124 shown in FIG. 1B. The walls 121a and 111 can be connected by metal structures, depending upon application. A dielectric plate 130 provides a vacuum seal under the floor 122. The dielectric plate 130 is preferably formed of a material that is transparent to microwave radiation. FIG. 1C depicts an embodiment in which the floor 122 has an opening 810 and an auxiliary ignition electrode 820 is disposed in the opening 810 with a vacuum seal (not shown). The auxiliary ignition electrode 820 is driven by an RF source 830 of an RF frequency in a range of 100 Hz-10 MHz. The RF source 830 may include an impedance match (not illustrated). The floor 122 and/or the wall 111 of the processing chamber 110 can function as a ground plane with respect to the auxiliary ignition electrode 820. Alternatively, an auxiliary ignition electrode can be located on the wall 111 by providing an additional opening and vacuum seal. The electrode 820 and the ground plane are separated only by the opening 810. In summary, the auxiliary ignition electrode 820 together with the ground plane (i.e., the floor 122 and/or the wall 111 of the chamber 110) form a capacitively coupled RF igniting circuit to help ignition of plasma that is ultimately sustained by microwave power.

Figure 2:
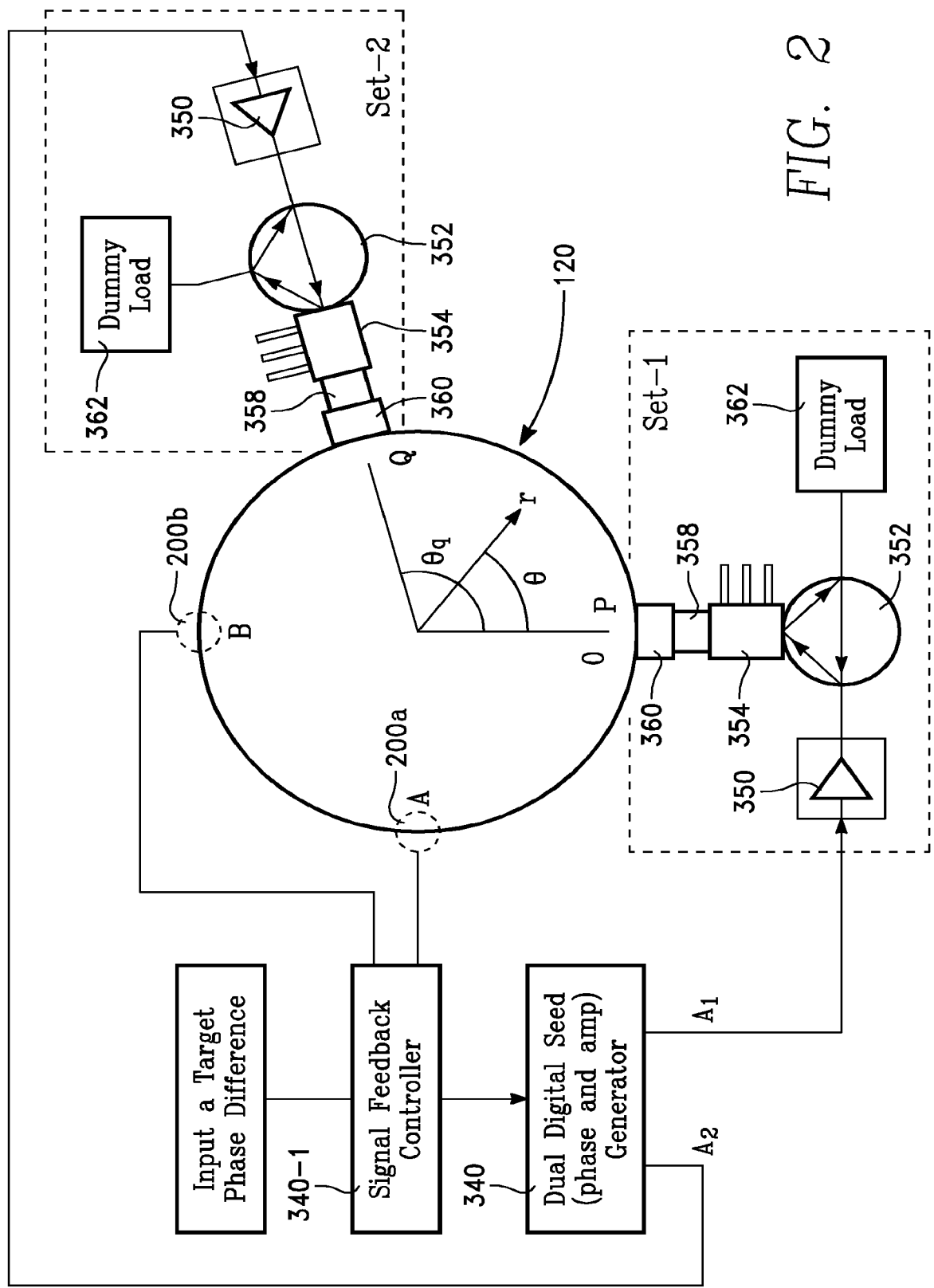
FIG. 2 is a schematic diagram of a system including the reactor of FIG. 1A.

FIG. 2 depicts an embodiment in which first and second microwave input ports, P and Q, in the side wall 121a are located at azimuthal positions spaced apart by a non-orthogonal angle relative to one another. In FIG. 2, two identical microwave modules, Set-1 and Set-2, are connected to the cylindrical cavity 120 at input port P (where $\theta=0$), and input port Q (where $\theta=\theta_q$), respectively. The other ends of the modules, Set-1 and Set-2, are connected to respective output signals, $A_1$ and $A_2$, of a dual digital seed (phase and amplitude) generator 340 that supplies microwave signals to the modules Set 1 and 2. In each module, the seed signal is amplified by a solid-state amplifier 350, which transmits it to a circulator 352 and a tuner 354, typically 3-pole stub tuner, to reduce reflection. The microwave is finally introduced into the cylindrical cavity 120 through a waveguide 360 with a radiating aperture, and excites eigen modes (resonances) in the cylindrical cavity 120. In general, transmission lines are used from the output of the amplifier 350 to the stub tuner 354. In this example, the radiating aperture is placed at the tip of the waveguide 360. A coaxial-to-waveguide transformer 358 is inserted between the tuner 354 and the waveguide 360. However, if a pole or loop antenna is adopted, the transformer 358 can be removed. In addition, a dummy load 362 is connected into one end of the circulator 352 to protect the amplifier 350.

Monitoring antennas 200a and 200b are orthogonally placed to receive microwave signals. The signal received by each one of the monitoring antennas 200a and 200b is processed by a signal feedback controller 340-1. In the feedback controller 340-1, the in- and quadrature-phase demodulation (IQ demodulation) is performed to measure the phase and amplitude of the received signal at the microwave frequency. When this phase and amplitude detection is performed for both the modules, Sets 1 and 2, the controller 340-1 calculates the mutual temporal phase difference $\Delta\varphi$ and the amplitudes of the output signals, $A_1$ and $A_2$ using digital signal processing. Since the circularly fast rotation of $TE_{mml}$ and $TM_{mnl}$ mode in a cylindrical cavity with a microwave carrier frequency requires $\Delta\varphi=\pm 90°$ and $A_1=A_2$, the controller 340-1 performs feedback-loop control, until the required relation is satisfied. This feed-back is operated independently from stub tuning works. Hence, as long as high speed controllers, such as an FPGA and a microcontroller, are used, a prompt conversion to the required condition is achieved in less than a millisecond.

Representation of Electromagnetic Fields of $TE_{mnl}$ in a Resonant Cavity

In FIG. 2, the angled (non-orthogonal) orientation of the input ports P and Q requires a new condition on a temporal phase delay $\Delta\varphi$ of Q from that of P to make the circular fast rotation. As already stated, the feedback monitoring system can take care of control to make the perfect circular fast rotation. However, it is desirable to set a best initial value of $\Delta\varphi$ so that feedback control time becomes minimized. $\Delta\varphi$ is now derived for $TE_{mnl}$ and $TM_{mnl}$. In the following, h=height of a cylindrical cavity, and R=radius of the cylindrical cavity.

For $TE_{mnl}$, the fields are represented for given a single integer 'm' in Gauss units:

$$\kappa^2 = \frac{\omega^2}{c^2}\varepsilon - k_{zl}^2 \qquad (1)$$

$$B_z = J_m(\kappa r)e^{im\theta}\left(A_+ e^{ik_{zl}z} + A_- e^{-ik_{zl}z}\right)$$

$$\vec{B}_t = \frac{ik_{zl}}{\kappa^2}e^{im\theta}\left[\kappa J'_m(\kappa r)\hat{r} + \frac{im}{r}J_m(\kappa r)\hat{\theta}\right]\left(A_+ e^{ik_{zl}z} - A_- e^{-ik_{zl}z}\right)$$

$$\vec{E}_t = \frac{i\omega}{c\kappa^2}e^{im\theta}\left[\frac{im}{r}J_m(\kappa r)\hat{r} - \kappa J'_m(\kappa r)\hat{\theta}\right]\left(A_+ e^{ik_{zl}z} + A_- e^{-ik_{zl}z}\right).$$

The boundary condition that the tangential components of electric fields in the cavity must vanish leads to the following relations:

$$A_+ = -A_- \equiv \frac{iA}{2} \quad (2)$$

$$k_{zl} = \frac{l\pi}{h} \quad l\text{: integer}$$

$$\kappa = y'_{mn}/R$$

where $$J'_m(y'_{mn}) = 0.$$

Then, the fields become $$B_z = AJ_m(\kappa r)e^{im\theta}\sin(k_{zl}z) \quad (3)$$

$$\vec{B}_t = A\frac{k_{zl}}{\kappa^2}e^{im\theta}\left[\kappa J'_m(\kappa r)\hat{r} + \frac{im}{r}J_m(\kappa r)\hat{\theta}\right]\cos(k_{zl}z)$$

$$\vec{E}_t = A\frac{\omega}{c\kappa^2}e^{im\theta}\left[\frac{-m}{r}J_m(\kappa r)\hat{r} - i\kappa J'_m(\kappa r)\hat{\theta}\right]\sin(k_{zl}z).$$

When considering two degenerate 'n' and '−n' along with the temporal term $e^{-i\omega t}$, we can write the magnetic fields as:

$$B_z = AJ_m(\kappa r)e^{im\theta}\sin(k_{zl}z)[a\cos(m\theta - \omega t) + b\cos(m\theta + \omega t)] \quad (4)$$

$$B_r = A\frac{k_{zl}}{\kappa}J'_m(\kappa r)\cos(k_{zl}z)[a\cos(m\theta - \omega t) + b\cos(m\theta + \omega t)])$$

$$B_\theta = -A\frac{mk_{zl}}{\kappa^2 r}J_m(\kappa r)\cos(k_{zl}z)[a\sin(m\theta - \omega t) + b\sin(m\theta + \omega t)]$$

where a and b are constants.

All the magnetic field components at a fixed (r, z) can be written with newly normalized constants a and b in the form of $$B = a\cos(\eta + m\theta - \omega t) + b\cos(\eta + m\theta + \omega t) \quad (5)$$

where $$\eta = 0 \text{ or } \frac{\pi}{2}.$$

Specifically, in Eqn. (5), "a" and "b" are amplitude coefficients of the anticlockwise and clockwise rotation, respectively.

Representation of Electromagnetic Fields of $TM_{mnl}$ in a Resonant Cavity

For $TM_{mnl}$, the fields are represented for given a single integer, 'm' in Gauss units:

$$\kappa^2 = \frac{\omega^2}{c^2}\varepsilon - k_{zl}^2 \quad (6)$$

$$E_z = J_m(\kappa r)e^{im\theta}\left(A_+e^{ik_{zl}z} + A_-e^{-ik_{zl}z}\right)$$

$$\vec{E}_t = \frac{ik_{zl}}{\kappa^2}e^{im\theta}\left[\kappa J'_m(\kappa r)\hat{r} + \frac{im}{r}J_m(\kappa r)\hat{\theta}\right]\left(A_+e^{ik_{zl}z} - A_-e^{-ik_{zl}z}\right)$$

$$\vec{B}_t = -\frac{i\omega\varepsilon}{c\kappa^2}e^{im\theta}\left[\frac{im}{r}J_m(\kappa r)\hat{r} - \kappa J'_m(\kappa r)\hat{\theta}\right]\left(A_+e^{ik_{zl}z} + A_-e^{-ik_{zl}z}\right).$$

In a similar manner to $TE_{mnl}$, the boundary condition that the tangential components of electric fields in the cavity must vanish leads to the following relations with slight changes $$A_+ = A_- \equiv \frac{A}{2} \quad (7)$$

$$k_{zl} = \frac{l\pi}{h} \quad l\text{: integer}$$

$$\kappa = y_{mn}/R$$

where $$J_m(y_{mn}) = 0.$$

$$E_z = AJ_m(\kappa r)e^{im\theta}\cos(k_{zl}z) \quad (8)$$

$$\vec{E}_t = -A\frac{k_{zl}}{\kappa^2}e^{im\theta}\left[\kappa J'_m(\kappa r)\hat{r} + \frac{im}{r}J_m(\kappa r)\hat{\theta}\right]\sin(k_{zl}z)$$

$$\vec{B}_t = A\frac{\omega\varepsilon}{c\kappa^2}e^{im\theta}\left[\frac{m}{r}J_m(\kappa r)\hat{r} + i\kappa J'_m(\kappa r)\hat{\theta}\right]\cos(k_{zl}z).$$

When considering both n and −n along with the temporal term $e^{-i\omega t}$, we can write the magnetic fields as $$B_z = 0 \quad (9)$$

$$B_r = -A\frac{\omega\varepsilon m}{c\kappa^2 r}J_m(\kappa r)\cos(k_{zl}z)[a\cos(m\theta - \omega t) + b\cos(m\theta + \omega t)]$$

$$B_\theta = A\frac{\omega\varepsilon}{c\kappa r}J'_m(\kappa r)\cos(k_{zl}z)[a\sin(m\theta - \omega t) + b\sin(m\theta + \omega t)].$$

All the magnetic field components at a fixed (r, z) can be written with newly normalized constants a and b in the form of:

$$B = a\cos(\eta + m\theta - \omega t) + b\cos(\eta + m\theta + \omega t) \quad (10)$$

where $$\eta = 0 \text{ or } \frac{\pi}{2}.$$

Since Eqn. (10) is of identical form to Eqn. (5), the following discussions can be applied to both $TE_{mnl}$ and $TM_{mnl}$. For the sake of brevity, the term $\eta$ in Eqns. (5) and (10) will be dropped in the following discussion.

Single and Dual Injection for $TE_{mnl}$ and $TM_{mml}$

When considering wave excitation from Port P, anticlockwise and clockwise rotations are excited with equal probabilities as a first approximation. Then, the excited wave can be written by renormalizing the coefficients a and b in Eqn. (10) as unity:

$$H_P = \cos(m\theta - \omega t) + \cos(m\theta + \omega t). \tag{11}$$

Next, when exciting a wave from Port Q with the same power and frequency, however, with a temporal phase delay of $\Delta\phi$, the excited wave can be represented as:

$$H_Q = \cos[m(\theta - \Delta\theta) - (\omega t - \Delta\phi)] + \cos[m(\theta - \Delta\theta) + (\omega t - \Delta\phi)] \tag{12}$$

where $\Delta\theta$ is the angular offset in position of Port Q relative to Port P, and $\Delta\phi$ is the temporal phase difference between the microwave outputs $A_1$ and $A_2$. When exciting the cavity 120 from both input ports P and Q simultaneously, the excited wave can be given as a sum of Eqns. (11) and (12):

$$H_{tot} = \cos(m\theta - \omega t) + \cos(m\theta + \omega t) +$$
$$\cos[m(\theta - \Delta\theta) - (\omega t - \Delta\phi)] + \cos[m(\theta - \Delta\theta) + (\omega t - \Delta\phi)]. \tag{}$$

Or, factoring the anticlockwise $H_+$, and clockwise $H_-$ components:

$$H_{tot} = H_+ + H_- \tag{13}$$

where $$H_+ = \cos(m\theta - \omega t) + \cos t[m(\theta - \Delta\theta) - (\omega t - \Delta\phi)] = \tag{14}$$
$$2\cos\left[\frac{2m\theta - 2\omega t - m\Delta\theta + \Delta\phi}{2}\right]\cos\left(\frac{m\Delta\theta - \Delta\phi}{2}\right)$$

$$H_- = 2\cos\left(m\theta + \omega t + \frac{-m\Delta\theta + \Delta\phi}{2}\right)\cos\left(\frac{m\Delta\theta + \Delta\phi}{2}\right) \tag{15}$$

Condition for the Clockwise Rotation for $TE_{mnl}$ and $TM_{mnl}$

The anticlockwise term will vanish, if the last term of Eqn. (14) is null, explicitly:

$$\frac{n\Delta\theta - \Delta\phi}{2} = \frac{\pi}{2} + k\pi \text{ for } k = \text{integer}. \tag{16}$$

If the following condition as well as that of Eqn. (16) are simultaneously satisfied, $$\frac{n\Delta\theta + \Delta\phi}{2} = \frac{\pi}{2} + p\pi \text{ for } p = \text{integer} \tag{17}$$

then, neither the anticlockwise nor clockwise waves are excited. This simultaneous condition can be provided by:

$$\begin{cases} \frac{m\Delta\theta - \Delta\phi}{2} = \frac{\pi}{2} + k\pi & k = \text{integer} \\ \Delta\phi = q\pi & q = \text{integer} \end{cases}.$$

Conversely, the necessary and sufficient condition to excite only the clockwise rotation for $TE_{nml}$ or $TM_{nml}$ can be summarized as:

$$\begin{cases} \frac{m\Delta\theta - \Delta\phi}{2} = \frac{\pi}{2} + k\pi & k\text{:integer} \\ \Delta\phi \neq q\pi & q\text{:integer} \end{cases}. \tag{18}$$

To maximize the energy transfer efficiency of the clockwise rotation, the last term of Eqn. (15) must be $\pm 1$, simultaneously with Eqn. (16), namely $$\begin{cases} \frac{m\Delta\theta - \Delta\phi}{2} = \frac{\pi}{2} + k\pi & k\text{:integer} \\ \frac{m\Delta\theta + \Delta\phi}{2} = p\pi & q\text{:integer} \end{cases}$$

which can be reduced to $$\Delta\phi = -\frac{\pi}{2} + (p - k)\pi \quad \Delta\theta = \frac{1 + 2(k + p)}{2m}\pi \quad k, p\text{:integers}. \tag{19}$$

Eqn. (19) is included as a special case of Eqn. (18). However, Eqn. (19) is preferable because of its maximum efficiency. A further simplification is given by setting k=p $$\Delta\phi = -\frac{\pi}{2} \quad \Delta\theta = \frac{1 + 4k}{2m}\pi \quad k\text{:integer}. \tag{20}$$

Microwave dual injections to excite a purely clockwise rotation with the maximum efficiency are summarized as follows:

Case of $TE_{111}$

Port $Q$ separated from Port $P$ by $\pm \frac{\pi}{2}$ (21)

Temporal phase delay: $-\frac{\pi}{2}$ (i.e. phase advance);

Case of $TE_{121}$

Port $Q$ separated from Port $P$ by $\frac{\pi}{4}$ or $\frac{5\pi}{4}$ (22)

Temporal phase delay: $-\frac{\pi}{2}$ (i.e. phase advanced).

Condition for Anticlockwise Rotation for $TE_{mnl}$ and $TM_{mml}$

In the same manner, the necessary and sufficient condition to excite only the anticlockwise rotation for $TE_{mnl}$ or $TM_{mnl}$ can be summarized as:

$$\begin{cases} \frac{m\Delta\theta + \Delta\phi}{2} = \frac{\pi}{2} + k\pi & k\text{:integer} \\ \Delta\phi \neq q\pi & q\text{:integer} \end{cases}$$ (23)

Eqn. (23) defines $\Delta\theta$ and $\Delta\varnothing$ as a function of the user-selected indices m, n and l of the modes $TE_{mnl}$ or $TM_{mnl}$. To maximize the energy efficiency of the anticlockwise rotation, the last term of Eqn. (16) should be ±1, simultaneously with Eqn. (15), namely:

$$\begin{cases} \frac{m\Delta\theta + \Delta\phi}{2} = \frac{\pi}{2} + k\pi & k\text{: integer} \\ \frac{m\Delta\theta - \Delta\phi}{2} = p\pi & p\text{: integer} \end{cases}$$ (24)

which can be reduced to $$\Delta\phi = \frac{\pi}{2} + (k-p)\pi$$ (25)

$$\Delta\theta = \frac{1 + 2(k+p)}{2m}\pi$$

k, p: integers

Or, a simplification by setting k=p gives $$\Delta\phi = \frac{\pi}{2}$$ (26)

$$\Delta\theta = \frac{1 + 4k}{2m}\pi$$

k: integer.

Microwave dual injections to excite a purely clockwise rotation with the maximum efficiency are summarized as follows.

Case of $TE_{111}$

Port $Q$ separated from Port $P$ by $\pm \frac{\pi}{2}$ (27)

Temporal phase delay: $\frac{\pi}{2}$

Case of $TE_{121}$

Port $Q$ separated from Port $P$ by $\frac{\pi}{4}$ or $\frac{5\pi}{4}$ (28)

Temporal phase delay: $\frac{\pi}{2}$.

Each one of Eqns. 18-20 and 23-26 defines $\Delta\theta$ and $\Delta\varnothing$ as a function of the user-selected indices m, n and l of the modes $TE_{mnl}$ or $TM_{mnl}$.

In summary, a rotating microwave is established in the cavity 120 for any resonant mode $TE_{mnl}$ or $TM_{mnl}$ of the cavity, where the user is free to choose the values of the mode indices n, m and l. This is accomplished by setting the temporal phase difference $\Delta\varnothing$ and the azimuthal angle $\Delta\theta$ between the ports P and Q as functions of m, n and l, defined in an applicable one of the Eqns. 18-20 and 23-26. The foregoing is illustrated as a method in a block diagram of FIG. 3A. In FIG. 3A, a plasma reactor including a cylindrical microwave cavity overlying a workpiece processing chamber is provided as in FIG. 3. First and second input ports P and Q are provided in a sidewall of the cylindrical microwave cavity spaced apart by an offset angle $\Delta\theta$, (block 600 of FIG. 3A). A next step is to generate rotating microwaves of mode $TE_{mml}$ or $TM_{mml}$ in the cylindrical microwave cavity, wherein at least two of m, n and l are user-selected values of a TE or TM mode (block 602). This is done by introducing into the cylindrical microwave cavity, through respective ones of the first and second coupling apertures, respective microwave signals separated by a temporal phase difference $\Delta\varnothing$ (block 604 of FIG. 3A). The method includes adjusting values of the offset angle $\Delta\theta$ and the temporal phase difference $\Delta\varnothing$ to values which are a function of at least two of the user-selected TE or TM mode indices m, n and l, so as to produce rotating microwaves of mode $TE_{mnl}$ or $TM_{mnl}$ in the cylindrical microwave cavity (block 606 of FIG. 3A).

Figure 3:
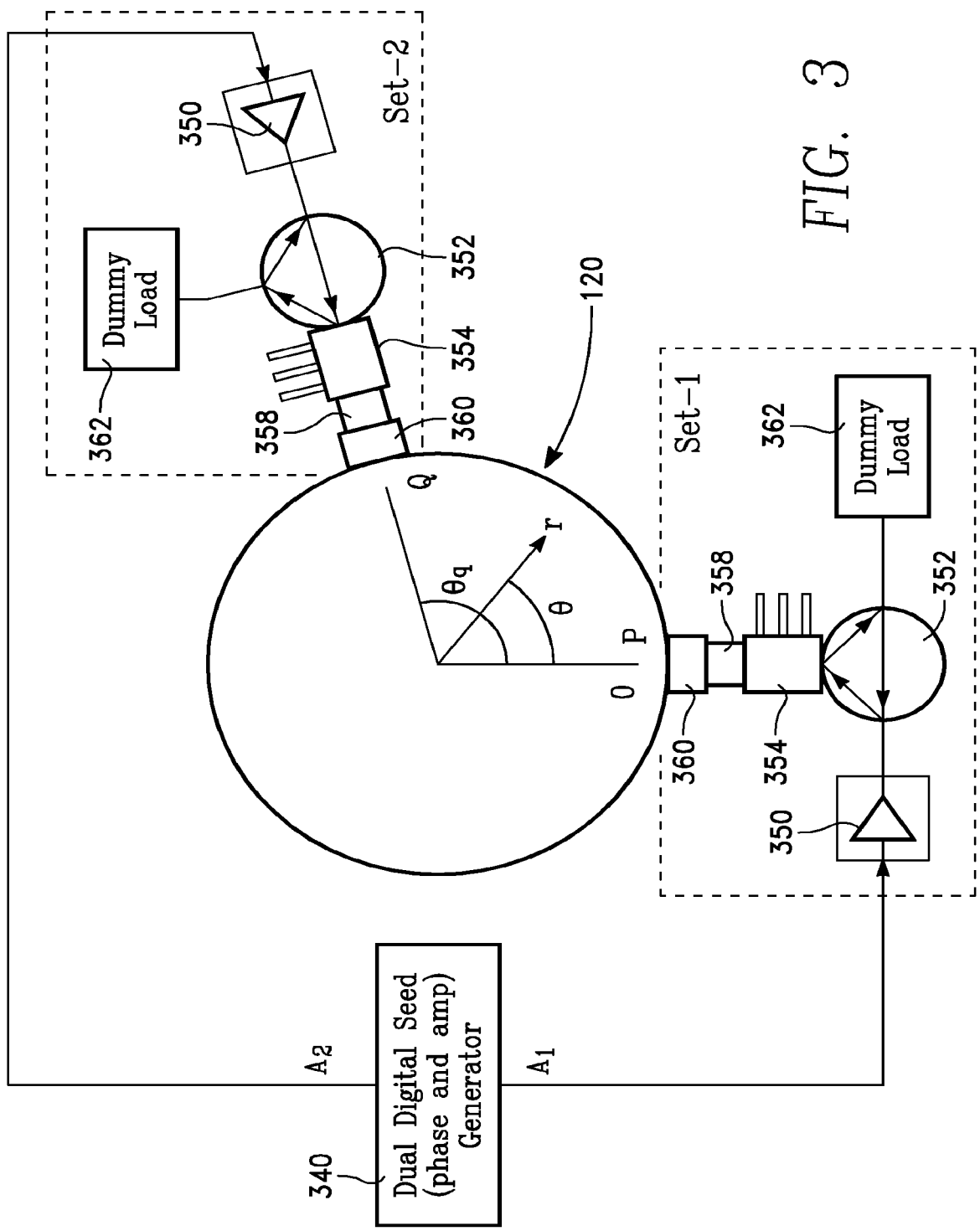
FIG. 3 is a schematic diagram of another system including the reactor of FIG. 1A.
Figure 3A:
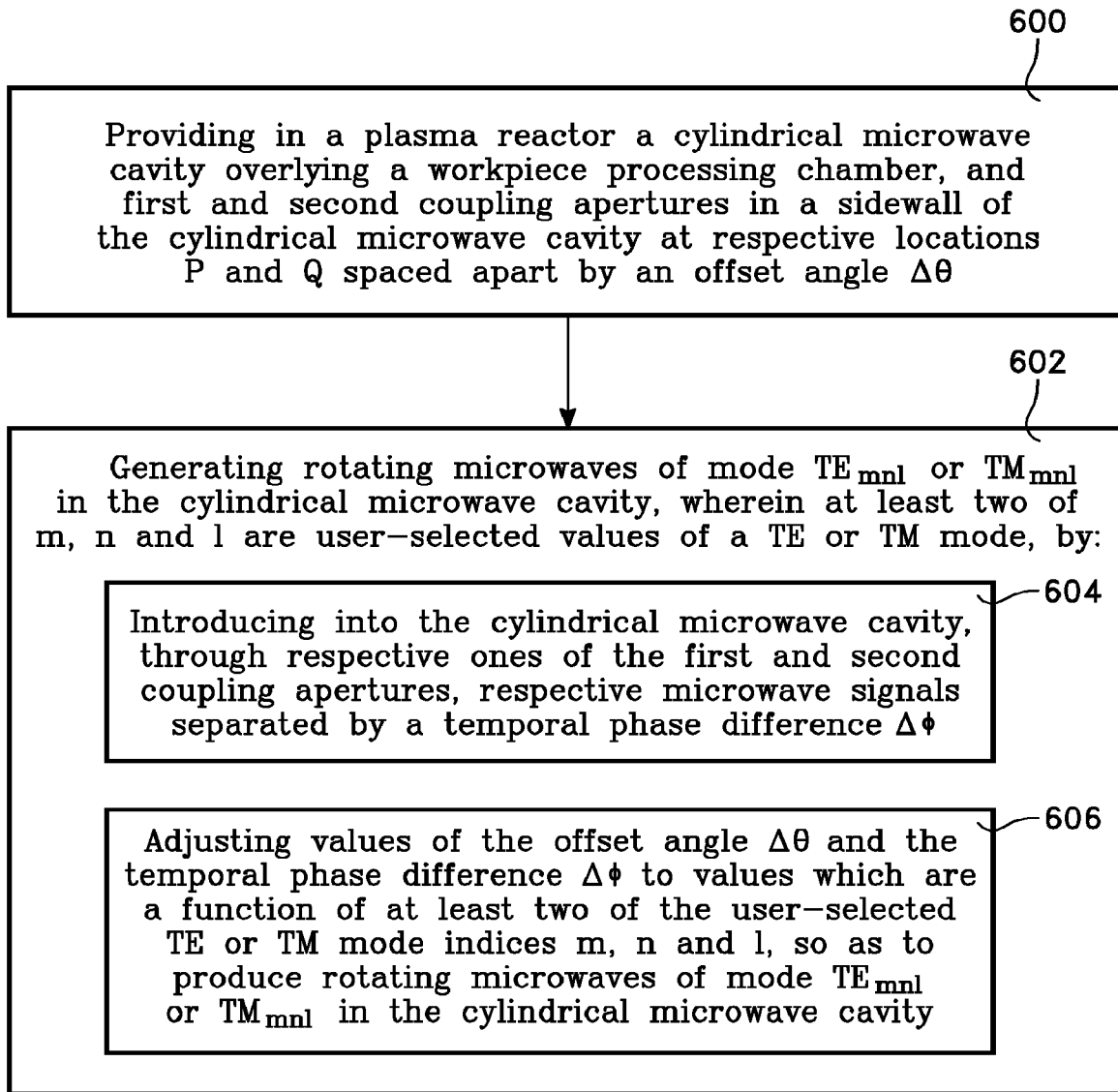
FIG. 3A is a block diagram depicting a method of operating the system of FIG. 3.

Generalized Amplitude Modulation for a Slow Rotation of $TE_{mnl}$ and $TM_{mnl}$ Mode in a Cylindrical Cavity FIG. 3 depicts a modification of the embodiment of FIG. 2 for amplitude modulation for a slow rotation of $TE_{mnl}$ and $TM_{mnl}$ mode in a cylindrical cavity. It is the same as that of FIG. 2 except for the absence of monitoring antennas and absence of a signal feedback controller.

Amplitude Modulations Radiated From Ports P and Q

Microwave fields radiated from Ports P and Q, where P and Q are spatially separated by 90 degrees, should have the following forms of amplitude modulation to make a slow rotation of frequency $\Omega_\alpha$ on the order of 1-1000 Hz:

$$\zeta_{Px} = \alpha\cos(\Omega_a t)\cos(\omega t + \varphi_h) \tag{29}$$

$$\zeta_{Qy} = \pm\alpha\sin(\Omega_a t)\cos(\omega t + \varphi_h) \tag{30}$$

where $\alpha$ is an arbitrary constant, $\Omega_\alpha$ is an angular frequency of rotation, t is a time, and $\varphi_h$ is an arbitrary initial phase, and the plus and minus signs of Eqn. (30) correspond to anti-clockwise and clockwise rotations, respectively. Then, an excited wave in a cylindrical cavity can be represented by using an azimuthal angle $\theta$:

$$\eta = 2\alpha\cos(\theta \mp \Omega_a t)\cos(\omega t + \varphi_h) = \tag{31}$$
$$[2\alpha\cos(\Omega_a t)\cos\theta + \{\pm 2\alpha\sin(\Omega_a t)\}\sin\theta]\cos(\omega t + \varphi_h)$$

When rewriting Eqns. (29)-(30) in x-y coordinate system, it can be stated: a vector input $$\vec{\zeta} = \{\alpha\cos(\Omega_a t)\hat{x} \pm \alpha\sin(\Omega_a t)\hat{y}\}\cos(\omega t + \varphi_h) \tag{32}$$

excites a vector wave of $$\vec{\eta} = \{2c\cos(\Omega_a t)\hat{x} \pm 2c\sin(\Omega_a t)\hat{y}\}\cos(\omega t + \varphi_h) \tag{33}$$

where $\hat{x}$ and $\hat{y}$ are unit base vectors in x and y directions, respectively.

In FIG. 3, the Ports P and Q are not necessarily located at a 90 degree interval. However, it is required that an excited wave should have the form of Eqn. (33). This problem can be converted to a coordinate transformation from an orthogonal x-y system to an oblique a-b system as shown in FIG. 4.

Figure 4:
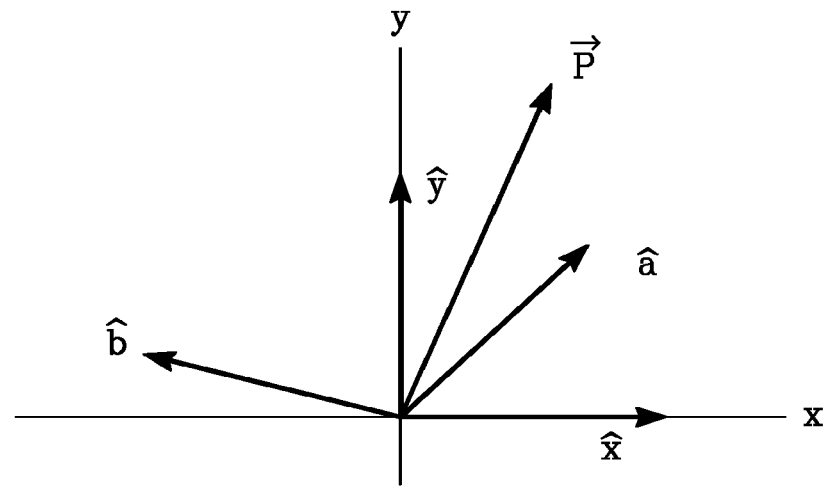
FIGS. 4 and 5 depict coordinate systems referred to in the detailed description.

In FIG. 4, a general vector $\vec{P}$ is defined as $$\vec{P} = p\hat{x} + q\hat{y} = r\hat{a} + s\hat{b} \tag{34}$$

where the base vectors in the a-b system are defined as $$\hat{a} = a_x\hat{x} + a_y\hat{y} \tag{35}$$

$$\hat{b} = b_x\hat{x} + b_y\hat{y} \tag{36}$$

Hence, when the ports P and Q are separated by 90 degrees, Eqn. (33) can be represented by $$\vec{P} = \alpha\cos\Omega_a t\hat{x} \pm \alpha\sin\Omega_a t\hat{y} \tag{36-2}$$

where the common temporal term $\cos(\omega t+\varphi_h)$ has been skipped.

Thus, p and q in Eqn. (34) are defined as:

$$p = \alpha\cos\Omega_a t \tag{36-3}$$

$$q = \pm\alpha\sin\Omega_a t \tag{36-4}$$

To obtain the expression in the oblique system, let the reciprocal bases $\hat{\alpha}$ and $\hat{\beta}$ correspond to the bases $\hat{a}$ and $\hat{b}$ $$\hat{\alpha} = \frac{\hat{b}\times\hat{z}}{\hat{z}\cdot(\hat{a}\times\hat{b})} \tag{36-5}$$

$$\hat{\beta} = \frac{\hat{z}\times\hat{a}}{\hat{z}\cdot(\hat{a}\times\hat{b})} \tag{36-6}$$

where $\hat{\alpha}$ and $\hat{\beta}$ are defined as $$\hat{a} = a_x\hat{x} + a_y\hat{y} \tag{36-7}$$

$$\hat{b} = b_x\hat{x} + b_y\hat{y} \tag{36-8}$$

Multiplying (36-5) and (36-6) on the second and third terms of Eqn. (34), the coordinate transformation is obtained $$r = \frac{pb_y - qb_x}{V} \tag{37}$$

$$s = \frac{-pa_y + qa_x}{V} \tag{38}$$

$$\text{where } V = a_x b_y - a_y b_x. \tag{39}$$

The coordinates of x-y system in Eqns. (32) and (33) are now transformed into those of an a-b system, as follows: Inserting Eqns. (36-3) and (36-4) into (37), (38), an explicit form is obtained:

$$r = \frac{\alpha\cos\Omega_a t\, b_y \mp \alpha\sin\Omega_a t\, b_x}{V} \tag{40}$$

$$s = \frac{-\alpha\cos\Omega_a t\, a_y \pm \alpha\sin\Omega_a t\, a_x}{V} \tag{41}$$

Figure 5:
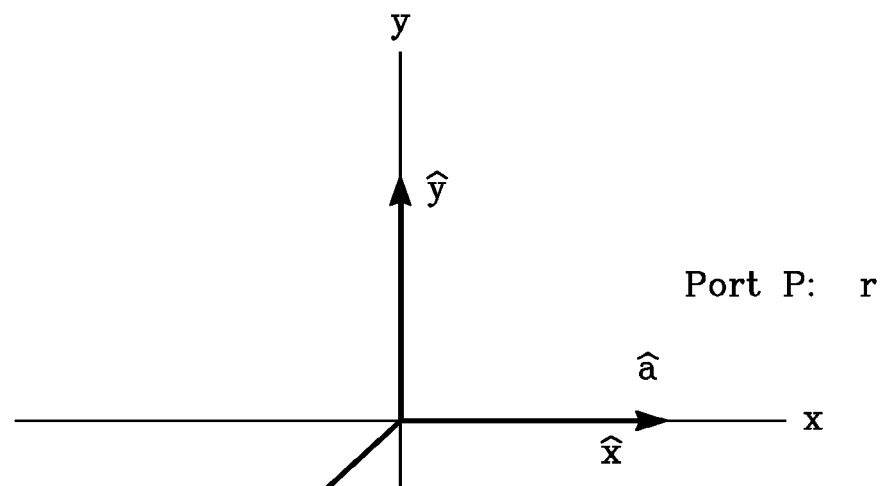

In summary, when the Ports P and Q are spaced apart with a general angle defined by Eqns (36-7) and (36-8) as shown in FIG. 3 or 5, a slowly rotating microwave field of rotation frequency of Qa can be excited by microwave field inputs from Ports P and Q represented by:

$$\zeta_{Pa} = r\cos(\omega t + \varphi_h) \quad (42\text{-}1)$$

$$\zeta_{Qb} = s\cos(\omega t + \varphi_h) \quad (42\text{-}2)$$

where r and s are defined in Eqns. (40) and (41), and the plus and minus sign of Eqn. (41) corresponds to anticlockwise and clockwise rotations, respectively. The forms of (42-1) and (42-2) are of the form of amplitude modulation with time varying functions of r and s.

Relating to Eqns. (22) and (28), we shall illustrate the case that Port Q is separated from port P by $$\frac{5\pi}{4}$$

to make a slow rotation of $TE_{121}$ as shown in FIG. 5:

$$\hat{a} = a_x\hat{x} + a_y\hat{y} = 1\hat{x} + 0\hat{y} \quad (43)$$

$$\hat{b} = b_x\hat{x} + b_y\hat{y} = \left(-\frac{1}{\sqrt{2}}\right)\hat{x} + \left(-\frac{1}{\sqrt{2}}\right)\hat{y}. \quad (44)$$

Substitution of Eqns. (43) and (44) into Eqns. (39)-(41) yields:

$$r = \alpha\cos\Omega_a t - \alpha\sin\Omega_a t \quad (45)$$

$$s = -\sqrt{2}\,\alpha\sin\Omega_a t. \quad (46)$$

This shows that, for the geometrical configuration of FIG. 5, when supplying microwave power in the form of Eqns. (45) and (46) from Ports P and Q respectively, the excited wave will be equal to that of Eqn. (33). This is verified by the fact that substitution of Eqns. (43)-(46) into Eqn. (34) yields Eqn. (36-2), which leads to Eqn. (32), eventually to Eqn. (33). For other configurations of Ports P and Q, the skilled worker can derive supplied powers of each port in the same manner as the foregoing.

Figures 6, 6A:
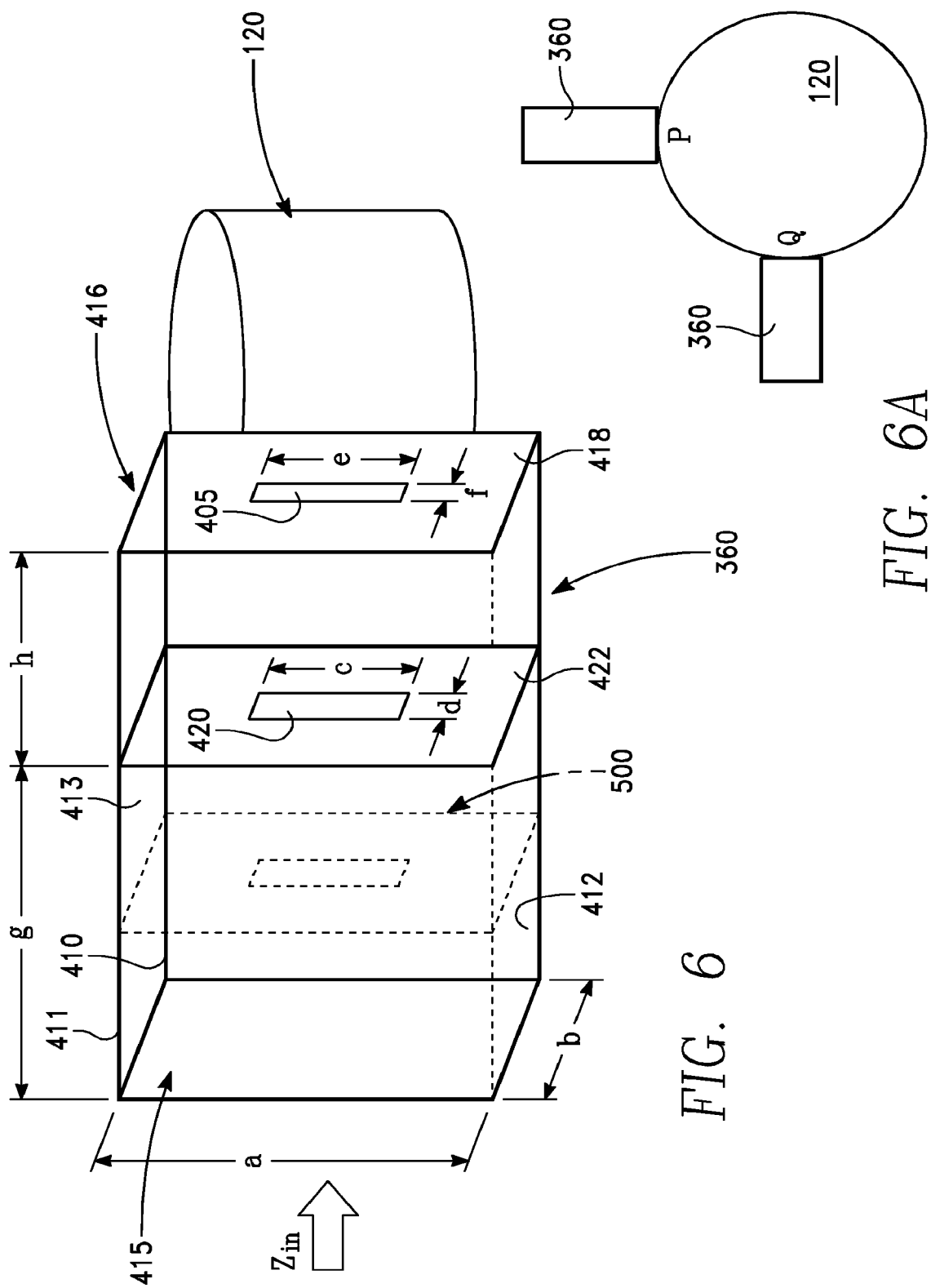
FIG. 6 is a diagram of a system including a pair of power-feeding waveguides having impedance-shifting irises.
FIG. 6A is a plan view corresponding to FIG. 6.

Impedance shifting by irises in a power-supplying waveguide:

Each of the two waveguides 360 of the embodiment of FIG. 2 or the embodiment of FIG. 3 has a radiation or coupling aperture 405 open through a respective one of the ports P and Q to the interior of the cylindrical cavity 120, as shown in FIG. 6. In the embodiment depicted in FIG. 6, the waveguide 360 is rectangular, having four conductive walls forming a rectangular cross-section, including a pair of side walls 410, 411, a floor 412 and a ceiling 413. An input opening 415 of the waveguide 360 is open for receiving microwaves. An opposite end 416 is covered by a wall 418. The coupling aperture 405 referred to above is formed in the wall 418 and is aligned with a corresponding one of the ports P and Q. Each port P and Q is an opening in the side wall of the cavity 120 and may match the dimensions of the coupling aperture 405.

The waveguide 360 may include one or more irises such as an iris 420. The iris 420 is formed as a rectangular window in a rectangular wall 422. Behavior of the waveguide 360 is determined by the dimensions of the rectangular input opening 415, a×b, the dimensions of the rectangular iris 420, c×d, the dimensions of the rectangular coupling aperture 405, e×f, the distance g between the iris 420 and the input end 415 and the distance h between the iris 420 and the coupling aperture 405. Other suitable shapes and dimensions can be chosen. To tune a chamber impedance, the coupling aperture size e×f is first adjusted. In one example, the best spectrum of a resonance "1" was obtained for e×f=60 mm×2 mm. For brevity of explanation, only the resonance "1" will be considered hereinafter.

Figure 9:
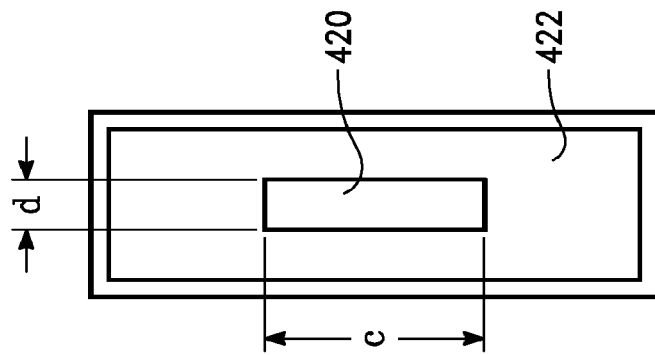
FIGS. 7, 8 and 9 depict different irises for use in each waveguide of FIG. 6.
Figure 8:
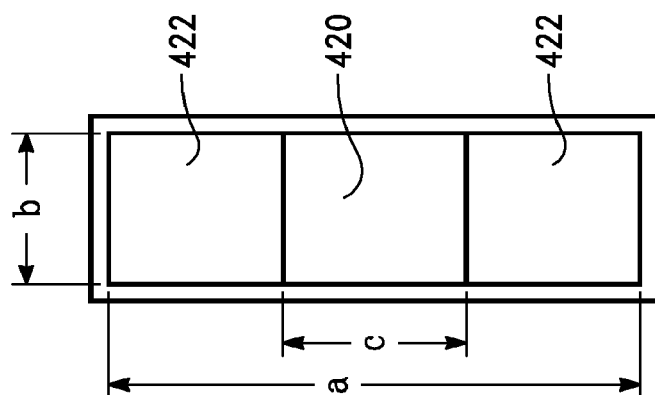
Figure 7:
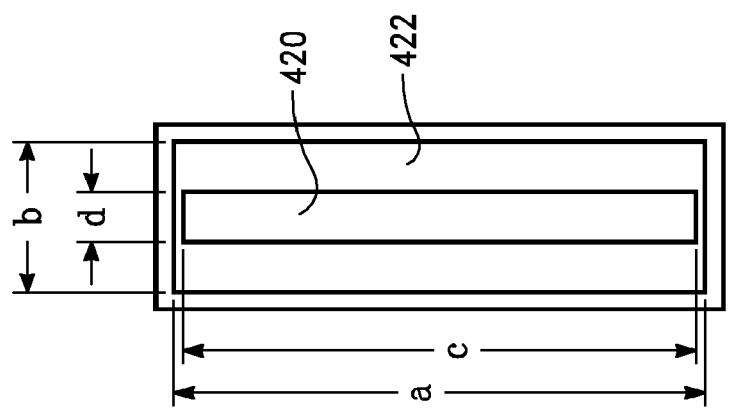

Next, an arbitrary distance h of the iris 420 from the coupling aperture 405 is chosen. In FIG. 7, a capacitive iris is chosen, and the value of the dimension d is adjusted. As the size of d is changed, the impedances of three resonances move. Furthermore, its quality factor Q represented by the size of a resonant circle in a Smith chart also changes. FIG. 8 depicts an inductive iris, with which different impedance shifts may be obtained. A resonant iris shown in FIG. 9 can make a critical coupling where the chamber impedance of a target frequency is located on the center of a Smith chart. In this configuration, the stub tuners of FIGS. 2 and 3 can be removed, leading to a simplified and cost-effective chamber design. However, since the critical coupling has a high Q value, this setting will generally deteriorate repeatability of tuning.

As indicated in dashed line, a second iris plate 500 can be placed in the waveguide 360 to obtain a preferable chamber impedance. A third iris plate may be added as well.

Advantages

A principal advantage of the embodiment of FIGS. 1-5 is that a rotating microwave for plasma processing can be produced for any suitable combination of user-selected mode indices m, n and l of modes $TE_{mnl}$ and $TM_{mnl}$ by suitable adjustment of spatial and temporal separation between microwave excitations at two different azimuthal locations. A principal advantage of the embodiment of FIGS. 6-9 is that the microwave chamber impedance can be adjusted without changing the chamber by introducing impedance shifting irises into the power-feeding waveguides coupled to the cavity.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a workpiece processing chamber including a workpiece support to hold a workpiece in a first plane;
   a cylindrical microwave cavity that overlies the workpiece processing chamber, the cylindrical microwave cavity including a floor that is parallel to the first plane and separates the cylindrical microwave cavity from the workpiece processing chamber and includes a plurality of apertures for microwave energy to pass into the workpiece processing chamber, a ceiling, a cylindrical sidewall, and exactly two microwave input ports in the cylindrical sidewall of said cylindrical microwave cavity, the two microwave input ports including a first input port and a second input port spaced apart by an oblique azimuthal angle;

two monitoring antennas in the cylindrical microwave cavity;

a microwave source having a microwave frequency and having a pair of microwave source outputs, wherein the microwave source is configured to generate microwave signals at the pair of microwave source outputs that are separated by an adjustable temporal phase difference; and a feedback controller configured to receive a target phase difference and two signals from the two monitoring antennas, determine a measured phase difference from the two signals, and determine an adjustment to the microwave source to bring the measured phase difference to the target phase difference.

2. The plasma reactor of claim 1, wherein the feedback controller is configured to determine the measured phase difference by an in- and quadrature-phase demodulation.

3. The plasma reactor of claim 2, wherein the feedback controller is configured to determine two measured amplitudes from the two signals by the in- and quadrature-phase demodulation.

4. The plasma reactor of claim 3, wherein the feedback controller is configured to determine an adjustment to the microwave source to bring the two measured amplitudes to be equal.

5. The plasma reactor of claim 1 wherein the two monitoring antennas are placed to be separated by a different angle than the oblique azimuthal angle.

6. The plasma reactor of claim 5, wherein the two monitoring antennas are orthogonally placed in the cylindrical microwave cavity.

7. The plasma reactor of claim 1, comprising a pair of respective waveguides, each of the waveguides has a microwave propagation direction, the microwave propagation direction extending toward an axis of symmetry of the cylindrical microwave cavity.

8. The plasma reactor of claim 7, wherein each of the respective waveguides including
a microwave input end coupled to a respective one of the microwave source outputs,
a microwave output end coupled to a respective one of the first and second input ports,
a coupling aperture plate at the output end, the coupling aperture plate having a rectangular coupling aperture therethrough, and
an iris plate between the coupling aperture plate and the microwave input end, the iris plate having a rectangular iris opening therethrough.

9. The plasma reactor of claim 8, wherein the rectangular coupling aperture and the rectangular iris opening have respective parallel axes along a long dimension of a respective one of the coupling aperture and the iris opening, the respective parallel axes being parallel to an axis of symmetry of the cylindrical microwave cavity.

10. The plasma reactor of claim 9, wherein the rectangular coupling aperture has long and short dimensions e and f, respectively, corresponding to a user-selected impedance.

11. The plasma reactor of claim 10, wherein the rectangular iris opening has long and short dimensions c and d, respectively, corresponding to a user-selected resonance.

12. The plasma reactor of claim 10, wherein the rectangular iris is a capacitive iris and has a long dimension parallel to an axis of symmetry of the cylindrical microwave cavity.

13. The plasma reactor of claim 10, wherein the rectangular iris is an inductive iris and has a short dimension parallel to an axis of symmetry of the cylindrical microwave cavity.

* * * * *